United States Patent [19]
Ish-Shalom

[11] Patent Number: 5,325,372
[45] Date of Patent: Jun. 28, 1994

[54] IMPLEMENTATION OF THE HDLC CRC CALCULATION

[75] Inventor: Ariel Ish-Shalom, Tel-Aviv, Israel

[73] Assignee: National Semiconductor Corporation, Santa Clara, Calif.

[21] Appl. No.: 125,083

[22] Filed: Sep. 22, 1993

Related U.S. Application Data

[63] Continuation of Ser. No. 564,037, Aug. 7, 1990, abandoned.

[51] Int. Cl.$^5$ .............................................. G06F 11/10
[52] U.S. Cl. ................................. 371/37.6; 371/37.7; 371/37.9
[58] Field of Search ............... 371/37.6, 37.7, 37.8; 395/575, 800

[56] References Cited

U.S. PATENT DOCUMENTS

| | | | |
|---|---|---|---|
| 4,030,067 | 6/1977 | Howell et al. | 340/146.1 AL |
| 4,703,485 | 10/1987 | Patel | 371/37 |
| 5,027,357 | 6/1991 | Yu et al. | 371/37.7 |
| 5,103,451 | 4/1992 | Fossey | 371/37.6 |
| 5,132,975 | 7/1992 | Avaneas | 371/37.6 |

OTHER PUBLICATIONS

Dilip V. Sarwate, Computation of Cyclic Redundancy Checks via Table Look-Up, Communications of the ACM, vol. 31, No. 8, Aug. 1988, pp. 1008-1013.
Gary S. Brown, "Demonstration Program to Compute the 32-bit CRC used as the Frame Check Sequence in ADCCP", 1986, pp. 1-3.
Thom Henderson et al, "ARCSVC.C 1.1", 1985, pp. 1-3.
Thom Henderson, "ARCSVC Version 2.20", 1986, pp. 1-2.
Brown et al., "CRC Calculation Stuff", 1986, pp. 1-3.
Perez et al.; Byte-Wise CRC Calculations; IEEE Micro; vol. 3, No. 3, 1983 pp. 40-50.
Method to Provide Software Calculation of a 32-Bit Frame Check Sequence, a Byte at a Time; IBM Technical Disclosure Bulletin; vol. 30, No. 12, Aug. 1988; pp. 458-464.

*Primary Examiner*—Gareth D. Shaw
*Assistant Examiner*—Dennis M. Butler
*Attorney, Agent, or Firm*—Limbach & Limbach

[57] ABSTRACT

In accordance with the present invention, a multi-bit CRC character is created by generating a most significant bit (MSB) portion and a least significant bit (LSB) portion in parallel and then combining the MSB and LSB portions to provide the CRC character. This is accomplished by first XORing a multi-bit input character and a current multi-bit CRC high value character stored in a CRC high value latch. The result of this initial XOR operation serves as the input to a high value look-up table which maps the input to a corresponding high value look-up table output character. The value look-up table output character is XORed with a current multi-bit CRC low value character stored in a CRC low value latch to generate an updated CRC high value character. In parallel with the generation of the updated CRC high value character, the result of the initial XOR operation is also provided as the input to a low value look-up table which maps the input to a corresponding updated CRC low value character. The updated CRC high and low value characters are combined to respectively provide the MSB and LSB portions of the CRC character. Both the high value latch and the low value latch are iteratively updated utilizing the updated CRC high and low value characters, respectively. The above-described operation is, thus, performed repetitively on an iteratively updated input character.

4 Claims, 2 Drawing Sheets

IMPLEMENTATION OF THE HDLC CRC CALCULATION

This is a continuation of co-pending application Ser. No. 07/564,037 filed on Aug. 7, 1990 now abandoned.

BACKGROUND OF THE INVENTION

1. Field of the Invention

The present invention relates to data communications systems and, in particular, to methods and apparatus for implementing a cyclic redundancy check (CRC) calculation in a High Level Data Link Control (HDLC) module.

2. Discussion of the Prior Art

Communications between stations in a data transmission network occur through the transmission of a series, or "frame", of information characters, with adjacent frames being separated by explicit or implicit start-stop patterns. The use of a unique start pattern ("start delimiter") and a unique stop pattern ("end delimiter") allows the receiving station to identify the exact beginning and the exact end of each frame.

William Stallings, *Local Networks*, Third Edition, Macmillan Publishing Co., 1990, Chapter 2, provides an overview of communications architectures for computer networks. As discussed by Stallings, to support communications between computer stations in a network, additional hardware and software is required. Communications hardware is reasonably standard. However, when communications is desired among different types of computer stations, the software development effort can become formidable, since different computers use different data formats and data exchange conventions.

Since development of special communications software for each network application is clearly too costly to be practical, the alternative is to establish common communications standards and a general computer architecture that defines the communications tasks.

A well known technique for defining computer architecture is "layering", wherein the computer's communications functions are partitioned into a hierarchical set of layers. Each layer of a station performs a related subset of the functions required to communicate with another station on the network.

The Open Systems Interconnection (OSI) model is an architectural standard that defines seven hierarchical communications layers. Information exchange between stations on an OSI network is achieved by having corresponding layers in different stations communicate in accordance with an established set of rules, known as a protocol.

FIG. 1 shows computer stations A and B, each of which, consistent with the OSI architecture, contains the seven OSI communications layers. When computer station A has data to send to computer station B, it transfers the data to its application layer. The application layer appends an application header (AH) which contains control data needed by the application layer in computer station B. The data is then passed down through the layer hierarchy, with each layer appending its own control header for use by the corresponding layer in computer station B. The data link layer generally appends both a header (LH) and a trailer (LT). The data link layer data unit, i.e., a "frame", is then transmitted by the physical layer onto the physical transmission medium.

As indicated above, the physical layer generally provides only bit stream service, that is, it serves only to physically transmit or receive, in a bit-by-bit, or serial manner, the bits of the binary information frame to/from the transmission medium. It is the data link layer than utilizes its bit-oriented communications protocol to define the frame.

One such standard OSI bit-oriented data link protocol is the so-called High-Level Data Link Control (HDLC) protocol.

According to the HDLC protocol, and as shown in FIG. 2, information is transmitted onto the physical transmission medium in frames that consist of six fields. The FLAG field is used for synchronization, indicating the start and end of a frame (i.e., it serves as the frame start and end delimiters). The ADDRESS field identifies the destination station for the frame. The control field identifies the function and purpose of the frame. The DATA frame contains the information to be transmitted. The CRC frame is a frame check sequence field that uses a 16-bit cyclic redundancy check (CRC).

As discussed by Stallings, the HDLC CRC field is a function of the contents of the Address, Control and Data fields. It is generated by the transmitter station and again by the receiver station. If the result generated by the receiver station differs from the CRC field of the received frame, then a transmission error has occurred.

In the implementation of the CRC calculation, the information to be transmitted is treated as a single binary number. This number is divided by a unique prime binary number and the remainder of this division operation is entered in the CRC field of the HDLC frame. When the frame is received, the receiver station performs the same division using the same prime number and compares the calculated remainder with the received CRC frame.

In a CRC calculation, the most commonly used divisors are a 17-bit primary number, which produces a 16-bit remainder, and a 33-bit prime number, which produces a 32-bit remainder. Use of the smaller divisor results in less overhead.

In a HDLC module, the CRC is a 16-bit sequence. It is defined as the complement of the sum (modulo 2) of:

1) the remainder of $$X^k(X^{15}+X^{14}+X^{13}\ldots X^2+X+1)$$

divided (modulo 2) by the generator polynomial $$X^{16}+X^{12}+X^5+\cdot$$

where k is the number of bits in the frame existing between, but not including, the final bit of the opening FLAG and the first bit of the CRC, excluding bits inserted for transparency, and 2) the remainder after multiplication by $X^{16}$ and then division (modulo 2) by the generator polynomial $$X^{16}+X^{12}+X^5+\cdot$$

of the content of the frame, existing between, but not including, the final bit of the opening FLAG and the first bit of the CRC, excluding bits inserted for transparency.

As a typical implementation, at the transmitter, the initial remainder of the division is preset to all 1s and is then modified by division by the generator polynomial, as described above, on the Address, Control and Data fields. The 1s complement of the resulting remainder is transmitted as the 16-bit HDLC CRC sequence.

At the receiver, the initial remainder is preset to all 1s and the serial incoming protected bits and the CRC, when divided by the generator polynomial will result in a remainder of 0001110100001111 ($X^{15}$ through $X^0$, respectively) in the absence of transmission errors. The CRC is transmitted to the line commencing with the coefficient of the highest term.

The CRC computation is the most critical ingredient of a HDLC handling module in terms of run-time performance. However, run-time performance of conventional HDLC CRC modules has become inadequate for many current applications.

SUMMARY OF THE INVENTION

The present invention provides methods and apparatus for improving the run-time performance of the CRC computation within a HDLC handling module.

In accordance with the present invention, a multi-bit character is created by generating a most significant bit (MSB) portion and a least significant bit (LSB) portion in parallel and then combining the MSB and LSB portions to provide the CRC character. This is accomplished by first XORing a multi-bit input character and a current multi-bit CRC high value character stored in a CRC high value latch. The result of this initial XOR operation serves as the input to a high value look-up table which maps the input to a corresponding high value look-up table output character. The high value look-up table output character is XORed with a current multi-bit CRC low value character stored in a CRC low value latch to generate an updated CRC high value character. In parallel with the generation of the updated CRC high value character, the result of the initial XOR operation is also provided as the input to a low value look-up table which maps the input to a corresponding updated CRC low value character. The updated CRC high and low value characters are combined to respectively provide the MSB and LSB portions of the CRC character. Both the high value latch and the low value latch are iteratively updated utilizing the updated CRC high and low value characters, respectively. The above-described operation is, thus, performed repetitively on an iteratively updated input character.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
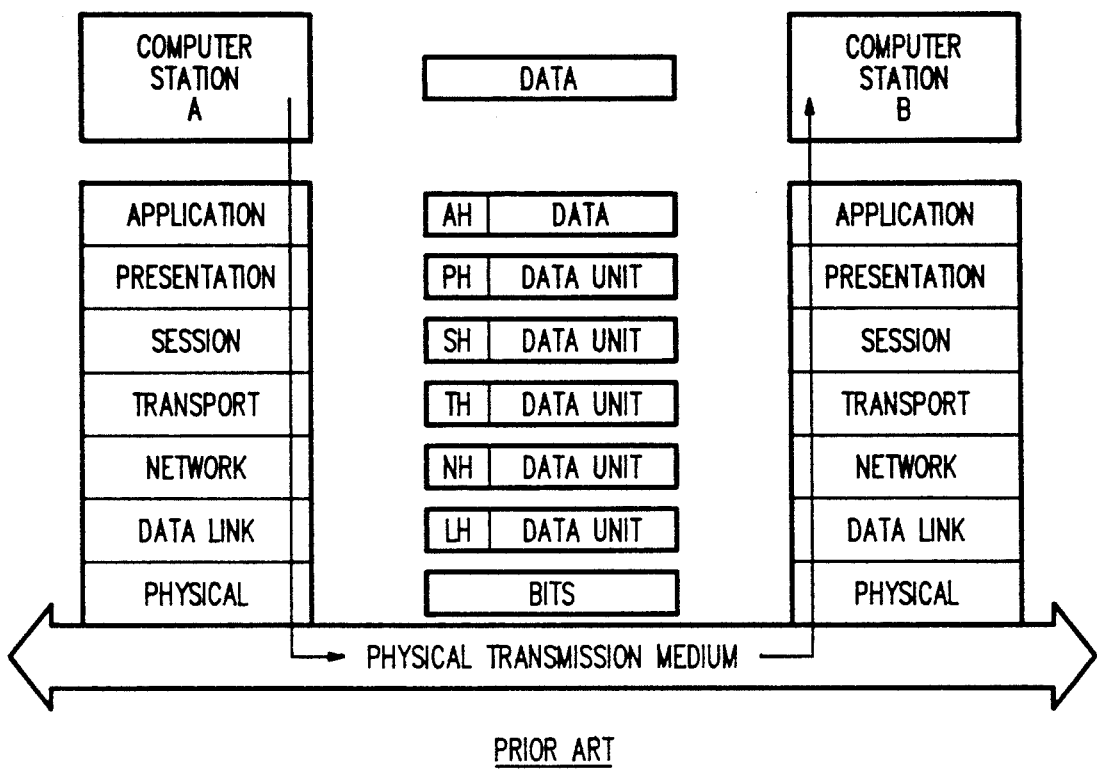
FIG. 1 is a block diagram illustrating the Open Systems Interconnection (OSI) model.
Figure 2:
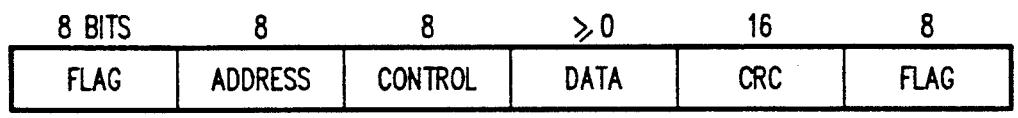
FIG. 2 is a block diagram illustrating the High-Level Data Link Control (HDLC) frame structure.
Figure 3:
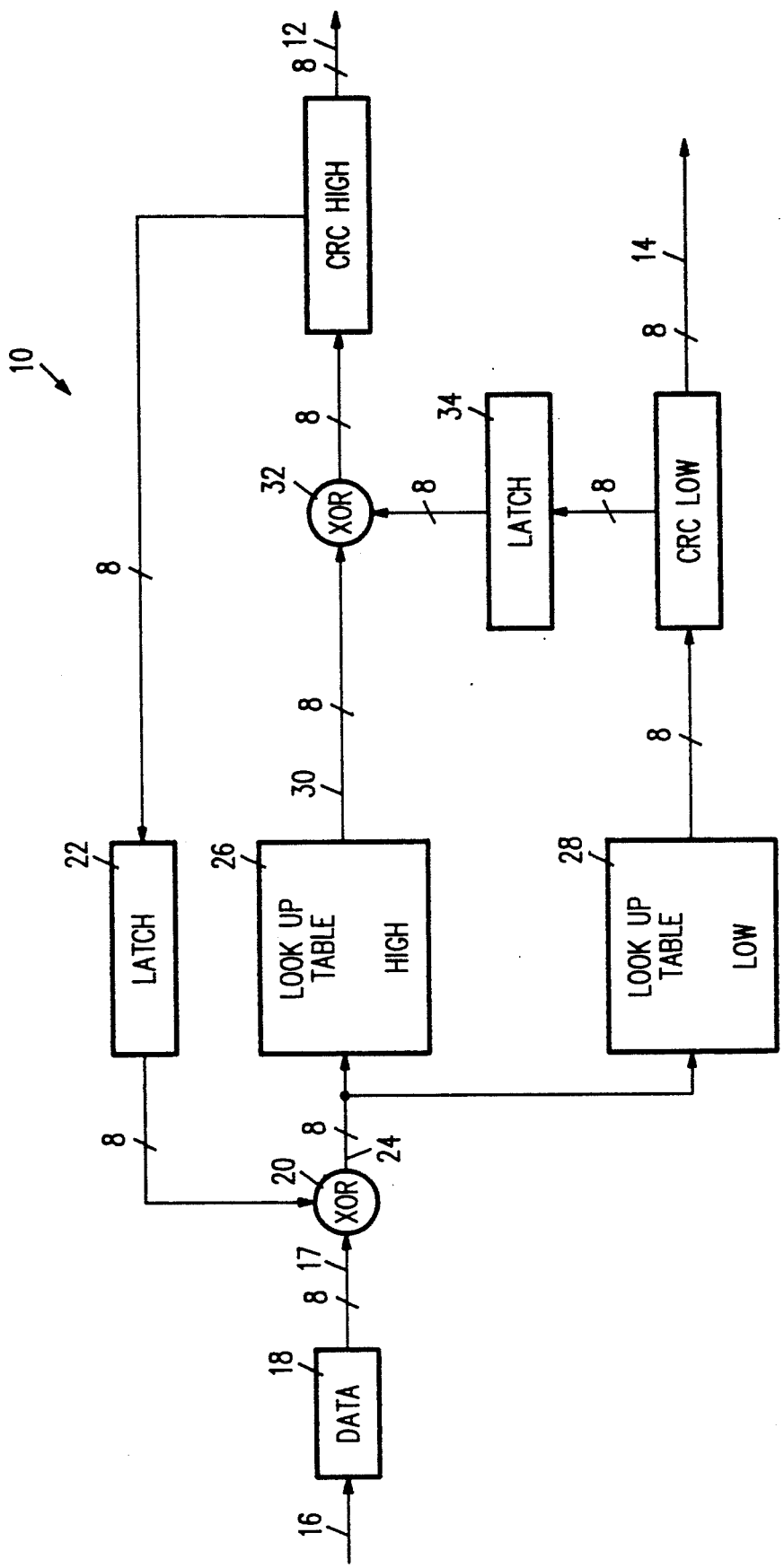
FIG. 3 is a block diagram illustrating a HDLC cyclic redundancy check (CRC) computation module in accordance with the present invention.

FIG. 3 shows a High-Level Data Link Control (HDLC) module 10 in which the most significant byte CRC_high 12 and the least significant byte CRC_low 14 of a 16-bit cyclic redundancy check (CRC) word are computed incrementally.

Shown in FIG. 3, the serial bit sequence 16 of the data to be transmitted is provided to an input data latch 18 which provides the data 17 to an XOR gate 20 eight bits at a time. The XOR gate 20 also receives the current most significant byte CRC_high 12 via latch 22. The 8-bit result 24 of the XOR operation is provided to two 8-bit×8-bit look-up tables: look-up table high 26 and look-up table low 28.

The 8-bit output 30 of look-up table high 26 is provided to a second XOR function 32, which also receives the current 8-bit output CRC_low of the look-up table low 28 via latch 34. The result of the operation of XOR function 32 is the 8-bit CRC_high output 12.

As stated above, the 8-bit CRC_high output 12 and the 8-bit CRC_low output 14 combine to provide, respectively, the most significant byte and the least significant byte of the 16-bit CRC word.

The operation of the HDLC CRC module 10 may be represented by the following relationships, wherein the term "CRC_temp" is a temporary byte variable, "Date_byte" is the processed data byte 17, "Luthi" and "Lutlo" are the high and low look-up tables 26 and 28, and ⊗ denotes an XOR operation respectively:

Initialization:

$CRC\_high = Initial\_CRC\_high;$ $CRC\_low = Initial\_CRC\_low;$

Incremental update:

$CRC\_temp = Data\_byte \otimes CRC\_high;$ $CRC\_high = CRC\_low \otimes Luthi [CRC\_temp^*];$ $CRC\_low = Lutlo[CRC\_temp]$ CRC checks:

$CRC\_high = Expected\_CRC\_high$ $CRC\_low = Expected\_CRC\_low$

That is, the computation of the 16-bit CRC word is done by computing the bytes that comprise it: CRC_high and CRC_low. The computation involves two types of operations: XOR operations and look-up operations.

Referring again to FIG. 3, the input byte 17 is XORed with the CRC_high byte currently latched in the CRC_high latch 22. The resulting byte is denoted by CRC_temp. The CRC_temp byte is then fed into the look-up table high (Luthi) 26 to generate an 8-bit Luthi[CRC_temp] term. The Luthi[CRC_temp] term is then XORed with the CRC_low value currently stored in latch 34 to provide an up-dated CRC_high byte. The CRC_temp byte is also fed into the look-up table low (Lutlo) 28 to generate an 8-bit Lutho[CRC_temp] term, which is the up-dated CRC_low byte.

It should be understood that various alternatives to the embodiments of the invention described herein may be employed in practicing the invention. It is intended that the following claims define the scope of the invention and that methods and apparatus within the scope of these claims and their equivalents be covered thereby.

I claim:

1. A method of generating a multi-bit binary cyclic redundancy check (CRC) data character that includes a most significant bit (MSB) portion and a least significant bit (LSB) portion, the method comprising;
- converting a serial bit sequence received by a cyclic redundancy check (CRC) value generator to a corresponding multi-bit binary input data character;
- storing a current multi-bit binary CRC high value data character in a CRC high value storage element;
- storing a current multi-bit binary CRC low value data character in a CRC low value storage element;
- providing both the multi-bit binary input data character and the current multi-bit binary CRC high value data character in parallel format as first and second inputs to an input XOR gate circuit such that the input XOR gate circuit generates a corresponding multi-bit binary input XOR gate circuit result data character in parallel format;
- providing the multi-bit binary input XOR gate circuit result data character in parallel format as an input to a high value look-up table element such that the high value look-up table element generates a corresponding multi-bit high value look-up table output data character in parallel format;
- providing both the multi-bit high value look-up table output data character and the current multi-bit binary CRC low value data character in parallel format as first and second inputs to a CRC high value XOR gate circuit such that the CRC high value XOR gate circuit generates a corresponding updated multi-bit binary CRC high value data character in parallel format;
- providing the multi-bit binary input XOR gate circuit result data character in parallel format to a low value look-up table element such that the low value look-up table element generates an updated multi-bit binary CRC low value data character in parallel format;
- providing the updated multi-bit binary CRC high value data character and the updated multi-bit binary CRC low value data character in parallel format as the MSB and the LSB portions, respectively, of a multi-bit binary CRC data character output of the cyclic redundancy check (CRC) value generator.

2. A method as in claim 1 and further comprising;
- concurrently with providing the updated multi-bit binary CRC high value data character as the MSB portion of the multi-bit binary CRC data character output, storing the updated multi-bit binary CRC high value data character in parallel format in the CRC high value storage element to serve as the current multi-bit binary CRC high value data character; and
- concurrently with providing the updated multi-bit binary CRC low value data character as the LSB portion of the multi-bit binary CRC data character output, storing the updated multi-bit binary CRC low value data in parallel format in the CRC low value storage element to serve as the current multi-bit binary CRC low value data character.

3. A method as in claim 1 wherein the serial bit sequence is received by a serial-to-parallel conversion element such that, with the receipt of each bit in the serial bit sequence by the serial-to-parallel conversion element, an iteratively updated corresponding multi-bit binary input data character is provided as an output of the serial-to-parallel conversion element, whereby each iteratively updated multi-bit binary input data character causes the multi-bit input XOR gate to iteratively generate an updated multi-bit binary input XOR gate circuit result data character, the method further comprising;
- for each iteratively updated corresponding multi-bit binary input data character provided as an output of the serial-to-parallel conversion element, and concurrently with providing the updated multi-bit binary CRC high value data character as the MSB portion of the multi-bit binary CRC data character output, iteratively updating both the current multi-bit binary CRC high value data character stored in the CRC high value storage element and the multi-bit binary CRC low value data character stored in the CRC low value storage element by iteratively replacing said current CRC high value data character with the updated CRC high value output data character generated by the CRC high value XOR gate circuit and by replacing said current CRC low value data character with the updated multi-bit CRC low value output data character provided by the low value look-up table circuit.

4. A cyclic redundancy check (CRC) value generator for generating a multi-bit binary cyclic redundancy check (CRC) data character that includes a most significant bit (MSB) portion and a least significant bit (LSB) portion, the circuitry comprising;
- a CRC high value storage element for storing a current multi-bit CRC high value data character;
- a CRC low value storage element for storing a current multi-bit CRC low value data character;
- a serial-to-parallel conversion element that receives an externally-provided serial bit sequence as an input and, for each new bit in the serial bit sequence received by the serial-to-parallel conversion element, generates a corresponding iteratively updated multi-bit binary output data character in parallel format;
- an input XOR gate circuit connected to receive both the iteratively updated multi-bit binary output data character from the serial-to-parallel conversion element and the current multi-bit CRC high value data character from the CRC high value storage element in parallel format as inputs and that performs an XOR logic operation on said inputs to generate a corresponding multi-bit binary input XOR gate circuit result data character in parallel format;
- high value look-up table means, connected to receive the multi-bit binary input XOR gate circuit result data character in parallel format as an input, for responding to said input by generating an updated multi-bit binary CRC low value data character in parallel format as an output;
- a CRC high value XOR gate circuit connected to receive both the updated multi-bit binary CRC high value data character from the high value look-up table circuit and the current multi-bit CRC low value data character from the CRC low value storage element in parallel format as inputs and that performs an XOR logic operation on said inputs to generate a corresponding updated multi-bit binary CRC high value data character in parallel format;
- low value look-up table means, connected to receive the multi-bit binary input XOR gate circuit result data character in parallel format as an input, and for responding to said input by generating an updated multi-bit binary CRC low value data character in parallel format; and output means for providing the updated multi-bit binary CRC high value data character and the updated multi-bit binary CRC low value data character in parallel format as the MSB and LSB portions, respectively, of a multi-bit binary CRC data character output of the cyclic redundancy check (CRC) value generator.

* * * * *